(12) United States Patent
Liu et al.

(10) Patent No.: US 11,615,908 B2
(45) Date of Patent: Mar. 28, 2023

(54) FLOW-GUIDING ROD, BUSHING AND CONVERTER TRANSFORMER SYSTEM

(71) Applicants: STATE GRID CORPORATION OF CHINA, Beijing (CN); TSINGHUA UNIVERSITY, Beijing (CN)

(72) Inventors: Shan Liu, Beijing (CN); Licheng Lu, Beijing (CN); Zehong Liu, Beijing (CN)

(73) Assignees: State Grid Corporation of China, Beijing (CN); Tsinghua University, Beijing (CN)

( * ) Notice: Subject to any disclaimer, the term of this patent is extended or adjusted under 35 U.S.C. 154(b) by 760 days.

(21) Appl. No.: 16/463,122

(22) PCT Filed: Nov. 21, 2018

(86) PCT No.: PCT/CN2018/116776
§ 371 (c)(1),
(2) Date: May 22, 2019

(87) PCT Pub. No.: WO2019/196412
PCT Pub. Date: Oct. 17, 2019

(65) Prior Publication Data
US 2020/0395159 A1    Dec. 17, 2020

(30) Foreign Application Priority Data
Apr. 9, 2018  (CN) .......................... 201810312629.8

(51) Int. Cl.
*H01F 27/16*    (2006.01)
*H01B 17/54*    (2006.01)
(Continued)

(52) U.S. Cl.
CPC ............. *H01F 27/16* (2013.01); *H01B 7/423* (2013.01); *H01B 17/54* (2013.01);
(Continued)

(58) Field of Classification Search
CPC .......... H01F 27/16; H01B 7/423; H01B 17/54
(Continued)

(56) References Cited

U.S. PATENT DOCUMENTS

| 1,983,371 A | 12/1934 | Hillebrand |
| 3,626,079 A | 12/1971 | Keen, Jr. et al. |

(Continued)

FOREIGN PATENT DOCUMENTS

| CN | 2192861 Y | 3/1995 |
| CN | 1426589 A | 6/2003 |

(Continued)

OTHER PUBLICATIONS

Extended European Search Report for Application No. 18880078.3 dated Jul. 15, 2020.
(Continued)

*Primary Examiner* — Devon Russell
(74) *Attorney, Agent, or Firm* — Alston & Bird LLP

(57) ABSTRACT

A flow-guiding rod includes a cooling channel provided in a rod portion of the flow-guiding rod, and a coolant inlet pipe and a coolant outlet pipe provided on end(s) of the flow-guiding rod. The coolant inlet pipe and the coolant outlet pipe are communicated with the cooling channel.

9 Claims, 4 Drawing Sheets

(51) Int. Cl.
*H01B 7/42* (2006.01)
*F28D 21/00* (2006.01)
*F28F 1/36* (2006.01)
*F28F 9/22* (2006.01)
*F28F 13/12* (2006.01)
*F28F 27/00* (2006.01)
*H05K 7/20* (2006.01)

(52) U.S. Cl.
CPC ........ *F28D 2021/0028* (2013.01); *F28F 1/36* (2013.01); *F28F 9/22* (2013.01); *F28F 13/12* (2013.01); *F28F 27/003* (2013.01); *F28F 2265/24* (2013.01); *H05K 7/20927* (2013.01)

(58) Field of Classification Search
USPC ............................ 165/142; 174/15.3, 15.6
See application file for complete search history.

(56) References Cited

U.S. PATENT DOCUMENTS

| | | | |
|---|---|---|---|
| 3,732,921 | A | 5/1973 | Hilicki et al. |
| 3,988,526 | A * | 10/1976 | Rasquin .................. H01B 9/00 |
| | | | 174/128.1 |
| 4,078,150 | A | 3/1978 | Daugherty et al. |
| 4,492,423 | A | 1/1985 | Reuter |
| 4,588,428 | A * | 5/1986 | Kanngiesser .......... H01B 7/423 |
| | | | 62/99 |
| 5,214,240 | A | 5/1993 | McArdle |
| 5,386,192 | A | 1/1995 | Marrone |
| 6,145,584 | A | 11/2000 | Baynes et al. |
| 7,045,704 | B2 | 5/2006 | Arcskoug |
| 2003/0164245 | A1 | 9/2003 | Areskoug |
| 2009/0126965 | A1 * | 5/2009 | Astrom ................... H01B 17/54 |
| | | | 174/15.3 |
| 2012/0247749 | A1 * | 10/2012 | Shimokaji ............... F25D 17/02 |
| | | | 165/64 |
| 2012/0318483 | A1 | 12/2012 | Cosby |
| 2017/0167804 | A1 | 6/2017 | MacKelvie |
| 2017/0356327 | A1 * | 12/2017 | Gonze .................... F01P 7/164 |

FOREIGN PATENT DOCUMENTS

| | | |
|---|---|---|
| CN | 201237969 Y | 5/2009 |
| CN | 203099179 U | 7/2013 |
| CN | 203311994 U | 11/2013 |
| CN | 204289014 U | 4/2015 |
| CN | 105336716 A | 2/2016 |
| CN | 106024171 A * | 10/2016 |
| CN | 208108877 U | 11/2018 |
| DE | 38 15 608 A1 | 12/1988 |
| EP | 2073220 A1 | 6/2009 |
| EP | 2244360 A2 | 10/2010 |
| EP | 2599564 A1 | 6/2013 |
| EP | 2645379 A1 | 10/2013 |
| EP | 2 804 831 B1 | 10/2016 |
| GB | 2342713 B | 4/2000 |
| JP | S58 184498 A | 10/1983 |
| KR | 10-2017-0005919 | 1/2017 |
| WO | WO 2007/078226 A1 | 7/2007 |

OTHER PUBLICATIONS

Office Action for Canadian Application No. 3,045,868 dated Aug. 27, 2020.
Office Action for Indian Patent Application No. 201947022996 dated Nov. 10, 2020.
International Search Report and Written Opinion for International Application No. PCT/CN2018/116776 dated Jan. 25, 2019, 19 pages.
Office Action for European Application No. 18880078.3 dated May 4, 2022, 10 pages.

* cited by examiner

FLOW-GUIDING ROD, BUSHING AND CONVERTER TRANSFORMER SYSTEM

CROSS-REFERENCE TO RELATED APPLICATIONS

This application is a national phase entry under 35 USC 371 of International Patent Application No. PCT/CN/2018/116776 filed on Nov. 21, 2018, which claims priority to Chinese Patent Application No. 201810312629.8, filed with the Chinese Patent Office on Apr. 9, 2018, titled "A FLOW-GUIDING ROD, BUSHING AND CONVERTER TRANSFORMER SYSTEM", which are incorporated herein by reference in their entirety.

TECHNICAL FIELD

The present disclosure relates to the field of power equipment technologies, and in particular, to a flow-guiding rod, a bushing and a converter transformer system.

BACKGROUND

In a direct current (DC) power transmission system, a converter transformer is located in a key position of electric energy interchange between an alternating current (AC) and a direct current (DC), and is responsible for transmitting voltages and currents between a grid-side alternating current network and a valve-side converter valve tower. The converter transformer is generally connected with a converter valve group in the converter valve tower via a bushing disposed at the valve side.

SUMMARY

Embodiments of the present disclosure provide a flow-guiding rod. A cooling channel is provided in a rod portion of the flow-guiding rod, a coolant inlet pipe and a coolant outlet pipe are provided on end(s) of the flow-guiding rod, and the coolant inlet pipe and the coolant outlet pipe are communicated with the cooling channel.

In some embodiments, the coolant is cooling water, the coolant inlet pipe is a water inlet pipe, the coolant outlet pipe is a water outlet pipe, and the water inlet pipe and the water outlet pipe are connected to a water cooling circulation loop of a converter valve tower.

In some embodiments, the rod portion of the flow-guiding rod is of a tubular shape, and the water cooling channel is disposed in a tube hole of the rod portion and extends along a length direction of the rod portion.

In some embodiments, a joint of the water inlet pipe jointed with the water cooling circulation loop of the converter valve tower and a joint of the water outlet pipe jointed with the water cooling circulation loop of the converter valve tower are located on a same end of the flow-guiding rod. A water outlet of the water inlet pipe and a water inlet of the water outlet pipe are respectively located on two ends of the water cooling channel along an axial direction of the flow-guiding rod.

In some embodiments, the rod portion of the flow-guiding rod is of a tubular shape, and a tube wall of the rod portion is hollow. The water cooling channel is disposed inside the tube wall, which is hollow, of the rod portion.

In some embodiments, the tube wall is a double-layer hollow tube wall. The double-layer hollow tube wall includes a first-layer tube wall and a second-layer tube wall nested sequentially along a radial direction of the flow-guiding rod, and the water cooling channel is provided between the first-layer tube wall and the second-layer tube wall.

In some embodiments, the tube wall is a triple-layer hollow tube wall. The triple-layer hollow tube wall includes a first-layer tube wall, a second-layer tube wall, and a third-layer tube wall nested sequentially along the radial direction of the flow-guiding rod. A joint of the water inlet pipe jointed with the water cooling circulation loop of the converter valve tower and a joint of the water outlet pipe jointed with the water cooling circulation loop of the converter valve tower are located on a same end of the flow-guiding rod, and a grille or flow-guiding holes are formed in the second-layer tube wall at one end thereof away from the water inlet pipe or the water outlet pipe. The water cooling channel includes an outer annular water cooling channel disposed between the third-layer tube wall and the second-layer tube wall, and an inner annular water cooling channel disposed between the second-layer tube wall and the first-layer tube wall. The outer annular water cooling channel is communicated with the inner annular water cooling channel via the grille or the flow-guiding hole.

In some embodiments, the water inlet pipe is communicated with the outer annular water cooling channel, and the water outlet pipe is communicated with the inner annular water cooling channel.

In some embodiments, a turbulent flow apparatus is provided in the water cooling channel. A water inlet of the turbulent flow apparatus is jointed with a water outlet of the water inlet pipe, and a water outlet of the turbulent flow apparatus is jointed with a water inlet of the water outlet pipe.

In some embodiments, the turbulent flow apparatus includes a spiral flow guide.

In some embodiments, the water inlet pipe is provided with a liquid pump and a flow control valve.

In some embodiments, the water outlet pipe is provided with a temperature detector.

In some embodiments, a heat dissipating controller is provided outside the flow-guiding rod. The heat dissipating controller is connected with the temperature detector, the liquid pump and the flow control valve, and is configured to control working conditions of the liquid pump and the flow control valve according to a water temperature of the water outlet pipe detected by the temperature detector, such that a temperature of the flow-guiding rod is within a preset scope.

Some embodiments of the present disclosure further provide a bushing, which includes the flow-guiding rod described above.

In some embodiments, the flow-guiding rod is sleeved with an insulating housing, and a resin impregnated paper core or an oilpaper core is sandwiched between the flow-guiding rod and the insulating housing.

Some embodiments of the present disclosure further provide a converter transformer system. The converter transformer system includes a converter valve tower, and a converter valve group in the converter valve tower is connected with a converter transformer via the bushing. The converter valve tower is provided with a water cooling circulation loop, and the cooling channel of the flow-guiding rod in the bushing is connected to the water cooling circulation loop via the coolant inlet pipe and the coolant outlet pipe.

BRIEF DESCRIPTION OF THE DRAWINGS

The accompanying drawings described herein are used to provide further understanding of the present disclosure and constitute a part of the present disclosure. The exemplary embodiments in the present disclosure and the descriptions thereof serve to explain the present disclosure, but do not constitute a limitation to the present disclosure. In the accompanying drawings.

DETAILED DESCRIPTION

Figure 1:
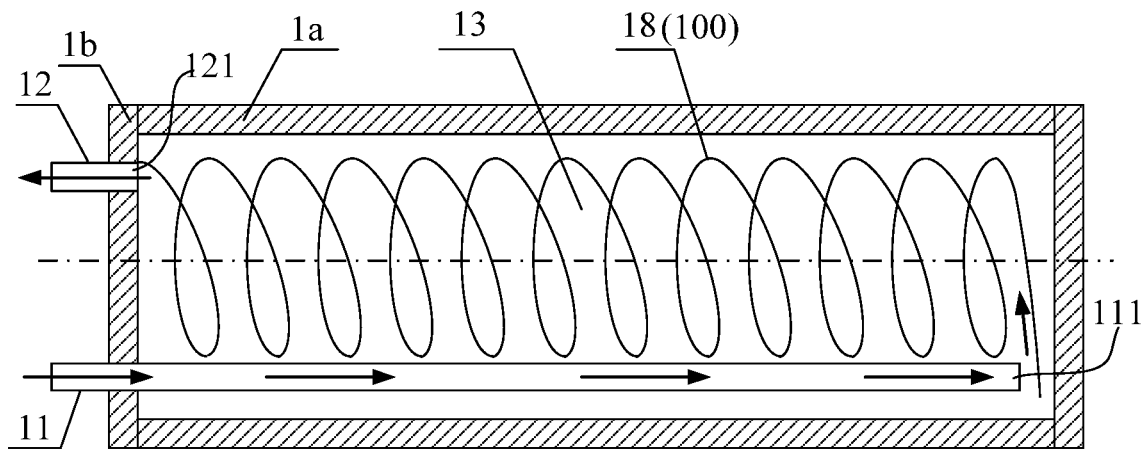
FIG. 1 is a schematic structure diagram of a flow-guiding rod provided in some embodiments of the present disclosure.

For ease of understanding, a flow-guiding rod, a bushing, and a converter transformer system provided in embodiments of the present disclosure are described in detail below in conjunction with the accompanying drawings. The flow-guiding rod provided in embodiments of the present disclosure is used for a bushing, and the bushing is configured to connect a converter transformer and a converter valve group in a converter valve tower, but is not limited thereto, a structure of the bushing may also be used for a bushing of a power equipment such as an oil circuit-breaker and a power station.

It will be understood that in the description of the present disclosure, orientations or positional relationships indicated by terms "center", "upper", "lower", "front", "rear", "left", "right", "vertical", "horizontal", "top", "bottom", "inner", "outer", etc. are based on orientations or positional relationships shown in the drawings, merely to facilitate and simplify the description of the present disclosure, but not to indicate or imply that the referred devices or elements must have a particular orientation, or must be constructed or operated in a particular orientation. Therefore they should not be construed as limitations to the present disclosure.

It will be noted that in the description of the present disclosure, unless otherwise explicitly specified or defined, terms "mounted", "connected", and "connection" should be understood in a broad sense. For example, fixed connection, detachable connection, and integrated connection are all available. A person of ordinary skill in the art can understand the implications of the above terms in the present disclosure according to the specific circumstances.

At present, as an important technical development tendency in a field of high-tension bushing, a dry-type resin impregnated paper bushing has features like safe operation, not easy to burst, etc. For the above bushing, a structure of dry-type resin impregnated paper bushing is mainly adopted. Using a resin impregnated paper as a heat dissipating insulating medium, the dry-type resin impregnated paper bushing has excellent mechanical properties and electrical properties, but hence it requires very complicated manufacturing processes, such as glue injection, resin pressing and immersion, degassing and solidifying, which adds to a difficulty of manufacturing a dry-type resin impregnated paper bushing. In addition, the difficulty of manufacturing a dry-type resin impregnated paper bushing is easy to increase exponentially as a volume or a weight of the dry-type resin impregnated paper bushing increases. As a result, the dry-type resin impregnated paper bushing with a large volume or a heavy weight, e.g. a dry-type resin impregnated paper bushing whose external diameter is more than 300 mm or whose impregnated resin has a weight of more than 1.5 tons, has a very low yield. Furthermore, as level of voltages and currents transmitted from a DC power transmission system increases continuously, in order to ensure an effect of heat dissipation and insulation of the bushing disposed on a converter valve-side, the external diameter of the bushing needs up to 300 mm and the impregnated resin shall have a weight of at least 5 tons, which causes great difficulty in bushing manufacturing and results in a very low yield rate.

In order to solve the above problem, some embodiments of the present disclosure provide a flow-guiding rod. A cooling channel is provided in the flow-guiding rod, a coolant inlet pipe and a coolant outlet pipe are provided on end(s) of the flow-guiding rod, and the coolant inlet pipe and the coolant outlet pipe are connected with the cooling channel. Thus when the flow-guiding rod is used for transmitting voltages and currents, a coolant flowing into the cooling channel through the coolant inlet pipe may effectively cool the flow-guiding rod, and reduce the operation temperature of the flow-guiding rod, i.e., reduce the quantity of heat concentrated on a surface of the flow-guiding rod caused by large currents and harmonic currents flowing through the flow-guiding rod. The coolant includes but is not limited to cooling water.

As shown in FIG. 1-FIG. 8, in some embodiments, a water cooling channel 13 is provided in a rod portion 1a of the flow-guiding rod, and a water inlet pipe 11 and a water outlet pipe 12 are provided on an end 1b of the flow-guiding rod. The water inlet pipe 11 and the water outlet pipe 12 are communicated with the water cooling channel 13, and the water inlet pipe 11 and the water outlet pipe 12 are connectable to a water cooling circulation loop 62 of a converter valve tower 6.

Figure 7:
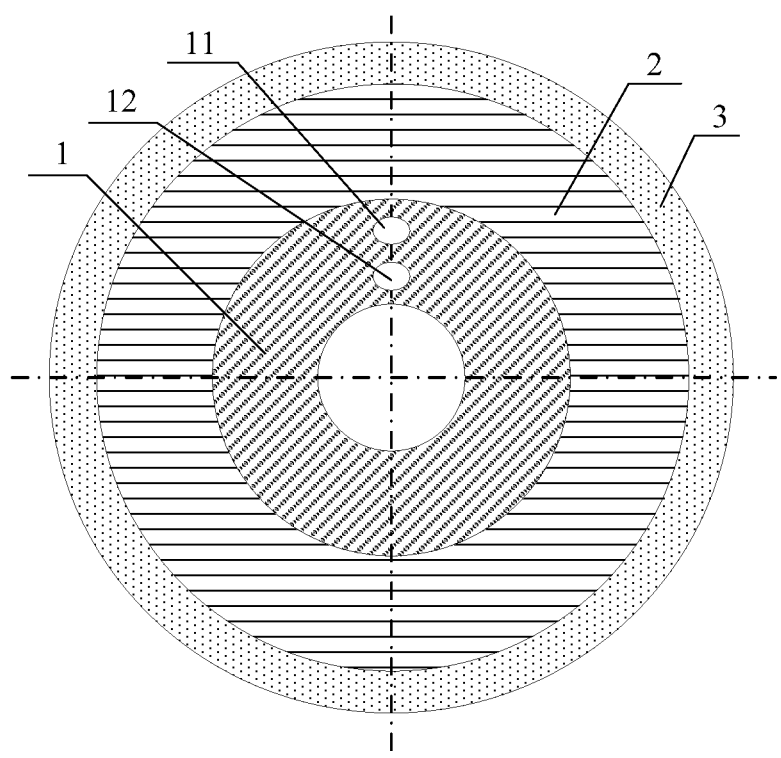
FIG. 7 is a cross-section view of a bushing provided in some embodiments of the present disclosure.

As a medium for transmitting voltages and currents, the flow-guiding rod 1 is usually made of a conducting material such as copper or aluminum. When the flow-guiding rod 1 is used for forming a bushing, as shown in FIG. 7, the flow-guiding rod 1 is sleeved with an insulating housing 3, and a resin impregnated paper core 2 or an oilpaper core is sandwiched between the flow-guiding rod 1 and the insulating housing 3. The insulating housing 3, for example, may be an epoxy resin housing made of an epoxy resin material or a ceramic housing made of a ceramic material. When the insulating housing 3 is an epoxy resin housing, the epoxy resin housing may be covered with a silicone rubber shed, and may be also formed integrally with the silicone rubber shed. When the insulating housing 3 is a ceramic housing, the ceramic housing may be covered with a ceramic shed, and may be also formed integrally with the ceramic shed.

In the flow-guiding rod 1 provided in the embodiments of the present disclosure, the water inlet pipe 11 and the water outlet pipe 12 are provided on the end 1b of the flow-guiding rod, and the water cooling channel 13 is provided in the rod portion 1*a* of the flow-guiding rod. Shapes and specific positions of the water inlet pipe 11 and the water outlet pipe 12 can be set according to actual requirements. For example, cross sections of the water inlet pipe 11 and the water outlet pipe 12 are of circular shapes or quadrangular shapes having arc segments. For example, the water inlet pipe 11 and the water outlet pipe 12 may be located on a same end of the flow-guiding rod 1 or located on two ends of the flow-guiding rod 1 respectively. A shape and an orientation of the water cooling channel 13 can be set such that the water cooling channel matches the structure of the flow-guiding rod 1. The water inlet pipe 11 and the water outlet pipe 12 are communicated with the water cooling channel 13, and thus when the flow-guiding rod 1 is used for transmitting voltages and currents, the cooling water flowing from the water inlet pipe 11 to the water cooling channel 13 may effectively cool the flow-guiding rod 1, and reduce the operation temperature of the flow-guiding rod 1.

Voltage and current transmission effects of the flow-guiding rod are easily influenced by the operation temperature of the flow-guiding rod. For example, an effective sectional area of the flow-guiding rod that can be used for transmitting voltages and currents is easy to increase as the operation temperature of the flow-guiding rod is reduced. Furthermore, when the flow-guiding rod is used for a bushing, a volume of a resin impregnated paper core in the bushing is also influenced by the quantity of heat concentrated on the surface of the flow-guiding rod. For example, the volume of the resin impregnated paper core may decrease as the heat concentrated on the surface of the flow-guiding rod is reduced. Compared with a flow-guiding rod without cooling measures, the flow-guiding rod 1 provided in the embodiments of the present disclosure may be designed to have a smaller radial dimension when it is used to transmit a same level of voltage and current, as the coolant is used to reduce the temperature. Consequently, the volume of the resin impregnated paper core 2 in the bushing where the flow-guiding rod 1 is located may also be reduced moderately, thus reducing the weight of the resin impregnated paper core 2 in the bushing where the flow-guiding rod 1 is located, so as to decrease the manufacturing difficulty of the bushing, and improve the yield rate of the bushing. In addition, when the flow-guiding rod 1 provided in the embodiments of the present disclosure is used for transmitting voltages and currents, the coolant in the cooling channel may be used to cool the flow-guiding rod 1, reduce the operation temperature of the flow-guiding rod 1, improve the operation circumstances of the flow-guiding rod 1 and the bushing where the flow-guiding rod 1 is located, reduce the dielectric loss of the bushing, and thus improve the operational reliability of the bushing. In the flow-guiding rod 1 provided in some embodiments of the present disclosure, water cooling is adopted, and the water inlet pipe 11 and the water outlet pipe 12 are connected to the water cooling circulation loop 62 of the converter valve tower 6. In this way, the water cooling channel 13 of the flow-guiding rod 1 may be integrated with the water cooling circulation loop 62 of the converter valve tower 6, and thus flow circulation of the cooling water may be managed uniformly, and water cooling of the converter transformer system where the flow-guiding rod 1 and the converter valve tower 6 are located may be controlled uniformly.

Figure 2:
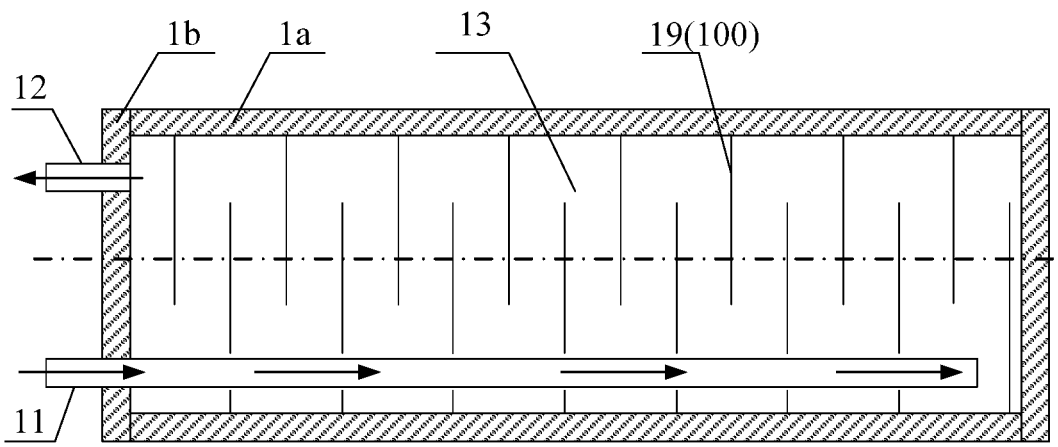
FIG. 2 is a schematic structure diagram of another flow-guiding rod provided in some embodiments of the present disclosure.
Figure 3:
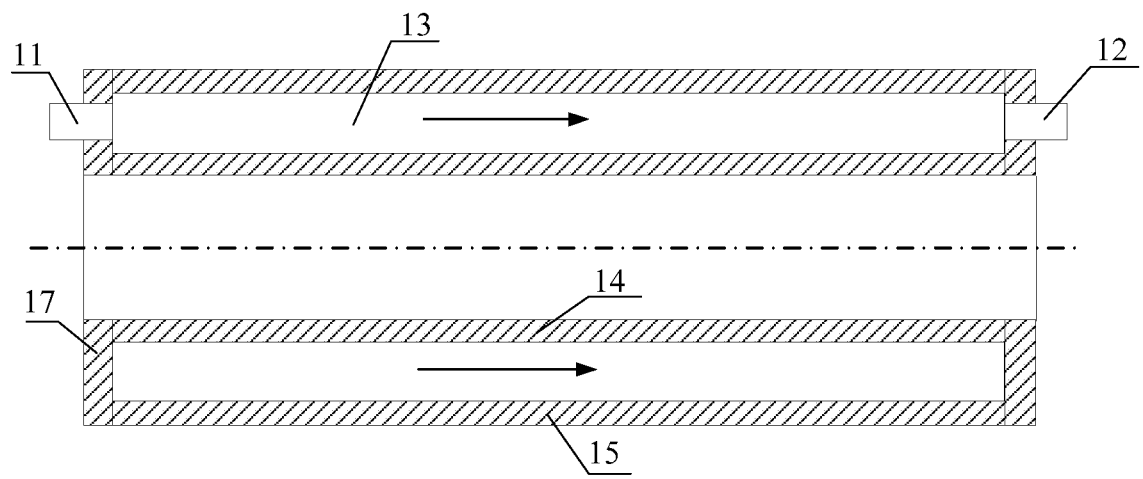
FIG. 3 is a schematic structure diagram of yet another flow-guiding rod provided in some embodiments of the present disclosure.
Figure 5:
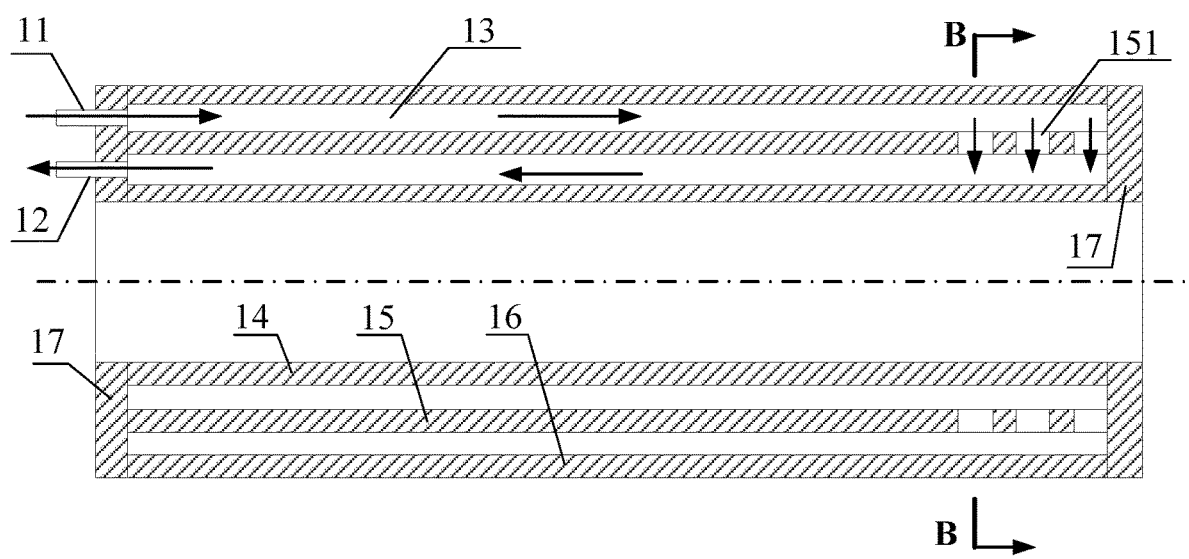
FIG. 5 is a sectional view of the flow-guiding rod shown in FIG. 4 along a sectional line A-A.

The shape and the orientation of the water cooling channel 13 match the structure of the flow-guiding rod 1. The rod portion 1*a* of the flow-guiding rod 1 is usually in a tubular shape, and the water cooling channel 13 can be disposed inside a tube hole of the rod portion 1*a* of the flow-guiding rod, as shown in FIG. 1 and FIG. 2. Alternatively, as shown in FIG. 3 and FIG. 5, the water cooling channel 13 can be disposed inside a tube wall of the rod portion 1*a* of the flow-guiding rod.

In some embodiments of the present disclosure, referring to FIG. 1 and FIG. 2, the water cooling channel 13 is disposed inside the tube hole of the rod portion 1*a* of the flow-guiding rod, and extends along a length direction of the rod portion 1*a*. That is, the tube hole of the rod portion 1*a* of the flow-guiding rod can be used directly as the water cooling channel 13.

In some embodiments of the present disclosure, in order to ensure the cooling effect of the cooling water, a water outlet 111 of the water inlet pipe 11 and a water inlet 121 of the water outlet pipe 12 are respectively located on two ends of the water cooling channel 13 along an axial direction of the flow-guiding rod. However, for ease of connection with an external water cooling facility, a joint of the water inlet pipe 11 jointed with the external water cooling facility and a joint of the water outlet pipe 12 jointed with the external water cooling facility are located on a same end of the flow-guiding rod. For example, as shown in FIG. 1, a long pipe is used as the water inlet pipe 11, which extends into the water cooling channel 13 along the axial direction of the flow-guiding rod, so as to carry the cooling water to a right side of the flow-guiding rod. That is, the water outlet 111 of the water inlet pipe 11 is close to an end of the flow-guiding rod not installed with the water inlet pipe 11 and the water outlet pipe 12. A short pipe is used as the water outlet pipe 12, and the water inlet 121 of the water outlet pipe 12 is located on a left end of the flow-guiding rod, i.e., an end of the flow-guiding rod installed with the water outlet pipe 12.

In some embodiments of the present disclosure, in order to reduce a surge pressure of the cooling water on the flow-guiding rod, and improve the cooling effect of the cooling water on the flow-guiding rod, a turbulent flow apparatus 100 may be provided in the water cooling channel 13. A structure of the turbulent flow apparatus 100 may be designed according to an actual requirement. It is available as long as the water inlet of the turbulent flow apparatus 100 is jointed with the water outlet 111 of the water inlet pipe 11 and the water outlet of the turbulent flow apparatus 100 is jointed with the water inlet 121 of the water outlet pipe 12.

Exemplarily, a flow guide 18 having a spiral shape as shown in FIG. 1 is adopted as the turbulent flow apparatus 100. The flow guide 18 may be made of an insulating material such as epoxy resin. The flow guide 18 may be placed movably in the water cooling channel 13, that is, the flow guide 18 need not be placed fixedly in the water cooling channel 13. After the cooling water enters the water cooling channel 13 from the water inlet pipe 11, under a guiding effect of the flow guide 18, the cooling water can flow to the water inlet 121 of the water outlet pipe 12 along a spiral direction of the flow guide 18.

Of course, the structure of the turbulent flow apparatus 100 is not limited to the above structure. The turbulent flow apparatus 100 can optionally adopt a structure as shown in FIG. 2. Referring to FIG. 2, a plurality of flow-guiding plates 19 are provided in an interlaced manner on an inner wall of the water cooling channel 13, and the plurality of flow-guiding plates 19 form a continuous and winding cooling-water guiding channel in the water cooling channel 13.

In some embodiments of the present disclosure, the water cooling channel 13 is disposed inside the tube wall of the rod portion 1*a* of the flow-guiding rod, that is, the tube wall of the rod portion 1*a* of the flow-guiding rod is hollow. The shape and orientation of the water cooling channel 13 can be determined by the structure of the tube wall of the rod portion 1a of the flow-guiding rod. For ease of manufacture, the present embodiment provides two implementation modes below as examples.

For the first implementation mode, referring to FIG. 3, the tube wall of the rod portion 1a of the flow-guiding rod is a double-layer hollow tube wall. The double-layer hollow tube wall includes a first-layer tube wall 14 and a second-layer tube wall 15 nested sequentially along a radial direction of the flow-guiding rod. The water cooling channel 13 is provided between the first-layer tube wall 14 and the second-layer tube wall 15, and the water cooling channel 13 is a columnar channel with an annular cross section. Two ends of the water cooling channel 13 are sealed respectively by end covers 17. The water inlet pipe 11 and the water outlet pipe 12 may be located on two ends of the flow-guiding rod 1. For example, as shown in FIG. 3, the water inlet pipe 11 is installed on the end cover 17 of the flow-guiding rod 1 on the left, and the water outlet pipe 12 is installed on the end cover 17 of the flow-guiding rod 1 on the right.

Figure 4:
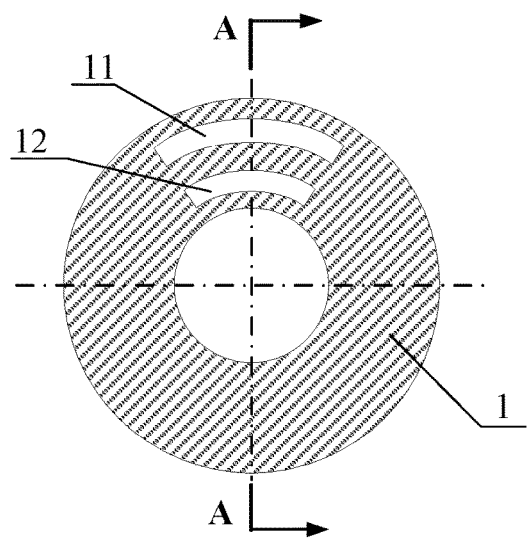
FIG. 4 is a schematic structure diagram of yet another flow-guiding rod provided in some embodiments of the present disclosure.
Figure 6:
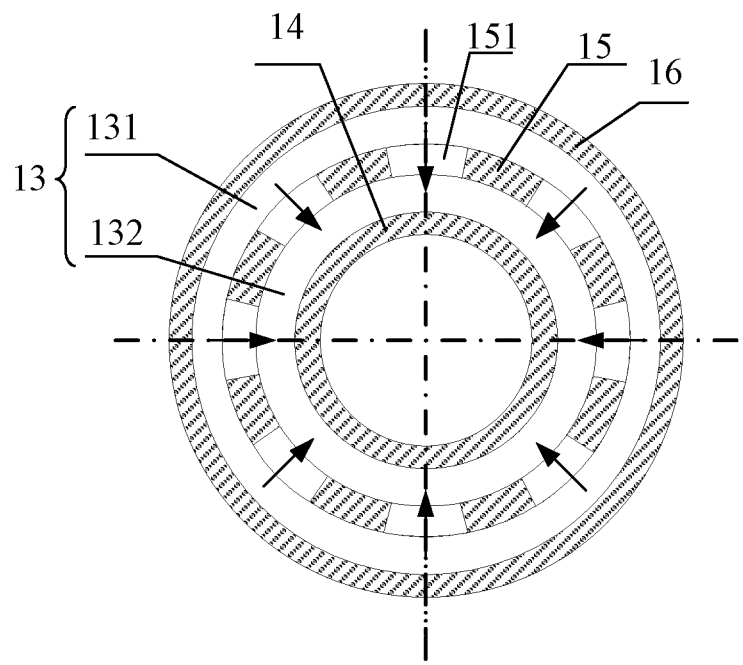
FIG. 6 is a sectional view of the flow-guiding rod shown in FIG. 5 along a sectional line B-B.

For the second implementation mode, referring to FIG. 4-FIG. 6, the tube wall of the rod portion 1a of the flow-guiding rod is a triple-layer hollow tube wall, the triple-layer hollow tube wall includes a first-layer tube wall 14, a second-layer tube wall 15 and a third-layer tube wall 16 nested sequentially along a radial direction of the flow-guiding rod. Two ends of the water cooling channel 13 are sealed respectively by corresponding end covers 17. The water inlet pipe 11 and the water outlet pipe 12 are installed on a same end cover 17 of the flow-guiding rod 1, and a grille or flow-guiding holes 151 are formed in the second-layer tube wall 15 at one end thereof away from the water inlet pipe 11 and the water outlet pipe 12. The water cooling channel 13 includes an outer annular water cooling channel 131 communicated with the water inlet pipe 11 and disposed between the third-layer tube wall 16 and the second-layer tube wall 15, and an inner annular water cooling channel 132 communicated with the water outlet pipe 12 and disposed between the second-layer tube wall 15 and the first-layer tube wall 14. Both the outer annular water cooling channel 131 and the inner annular water cooling channel 132 are a columnar channel with an annular cross section. The outer annular water cooling channel 131 is communicated with the inner annular water cooling channel 132 via the grille or the flow-guiding holes 151. After entering the outer annular water cooling channel 131 from the water inlet pipe 11, the cooling water can flow into the inner annular water cooling channel 132 via the grille or the flow-guiding holes 151 formed in the second-layer tube wall 15, and flow out from the water outlet pipe 12.

Hollow structures of the tube wall of the rod portion 1a of the flow-guiding rod are not limited to the above two kinds, and other hollow structures formed in similar ways or different ways are also available.

In the flow-guiding rod provided in the embodiments of the present disclosure, the multiple tube walls nested sequentially along the radial direction of the flow-guiding rod 1 constitute the hollow tube wall of the rod portion 1a of the flow-guiding rod, and a space between two adjacent tube walls forms the above water cooling channel 13. In this way, the flow-guiding rod 1 can be cooled uniformly, avoiding local overheating of the flow-guiding rod 1, and thus improving operation circumstances of the bushing at a valve-side.

When the flow-guiding rod provided in the present embodiment is used for transmitting voltages and currents, the heat caused by large currents or harmonic currents is easy to concentrate on an outer surface of the flow-guiding rod 1. In some embodiments of the present disclosure where the above second kind of hollow tube-wall structure is adopted, the water inlet pipe 11 is communicated with the outer annular water cooling channel 131, and the water outlet pipe 12 is communicated with the inner annular water cooling channel 132. Thus, the flow-guiding rod 1 may be better cooled, and the heat caused by large currents or harmonic currents may be prevented from concentrating on the outer surface of the flow-guiding rod 1.

The cooling water mentioned in the above embodiments is usually high-purity water. In order to ensure the cooling efficiency of the cooling water to the flow-guiding rod, in some embodiments of the present disclosure, the water inlet pipe 11 is provided with a liquid pump. The liquid pump is used to increase the pressure of the cooling water that enters the water cooling channel 13, which may accelerate flow of the cooling water in the water cooling channel 13, thus ensuring the cooling efficiency of the cooling water to the flow-guiding rod.

In some embodiments of the present disclosure, the water inlet pipe 11 is provided with a flow controller, and the water outlet pipe 12 is provided with a temperature detector. A flow quantity and a flow velocity of the cooling water may be controlled in real time using the flow controller to satisfy the cooling requirements of the flow-guiding rod 1 at different temperatures. Exemplarily, the flow controller may include a flow control valve or a throttle valve.

Figure 9:
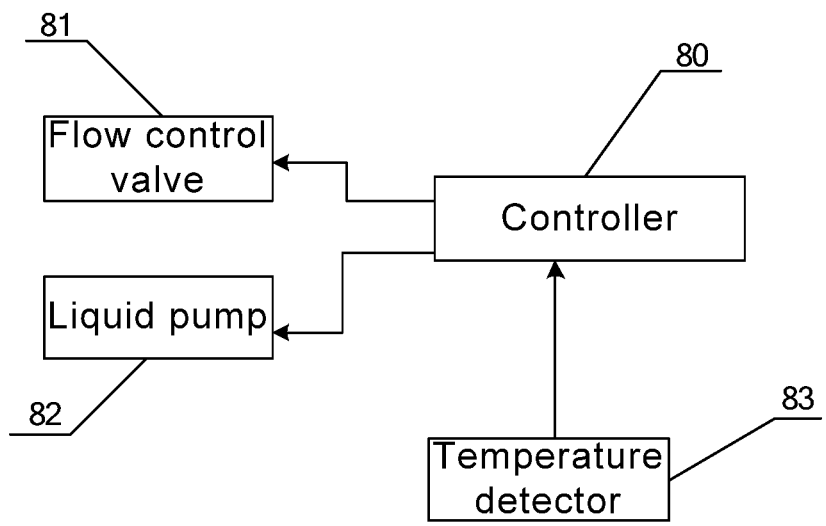
FIG. 9 is a schematic diagram of a heat-dissipating control structure of a flow-guiding rod in a converter transformer system provided in some embodiments of the present disclosure.

In some embodiments of the present disclosure, in order to realize automatic control, as shown in FIG. 9, a heat dissipating controller 80 is provided outside the flow-guiding rod, and an input end of the heat dissipating controller 80 is signal-connected to the temperature detector 83, such that temperatures of the cooling water at the water outlet pipe 12 can be obtained via the temperature detector 83. An output end of the heat dissipating controller 80 is signal-connected to the liquid pump 82 and the flow control valve 81, so as to control operation states of the liquid pump 82 and the flow control valve 81 automatically according to the acquired temperature of the cooling water at the water outlet pipe 12, thereby controlling the flow quantity and the flow velocity of the cooling water automatically, such that the temperature of the flow-guiding rod is within a preset scope. In this way, the temperature of the flow-guiding rod may be controlled automatically, such that it is kept within a temperature range to allow the flow-guiding rod to operate normally.

Embodiments of the present disclosure further provide a bushing. Referring to FIG. 7, the bushing includes the flow-guiding rod 1 provided in the above embodiments. In some embodiments, the flow-guiding rod 1 is sleeved with an insulating housing 3, and a resin impregnated paper core 2 or an oilpaper core is sandwiched between the flow-guiding rod 1 and the insulating housing 3. The flow-guiding rod 1 in the bushing provided in the embodiments of the present disclosure has same advantages and can achieve same beneficial effects as the flow-guiding rod 1 provided in the above embodiments, which will not be elaborated here.

The resin impregnated paper core 2 usually includes a plurality of layers of resin impregnated paper, and the plurality of layers of resin impregnated paper are molded in a vacuum pressure impregnation (VPI) process after being wound. Winding of the plurality of layers of resin impregnated paper at the time of implementation generally means that a plurality of layers of dry cable paper are wound to form a cable paper bushing core under specific conditions, and then the wound cable paper bushing core is put into a resin impregnated mold for preheating and vacuumization, thereby getting ready for a subsequent VPI. When the cable paper bushing core is processed in a VPI process, a mixed resin that is subjected to vacuum pretreatment is usually delivered to the resin impregnated mold under certain pressure, and the cable paper bushing core is thoroughly impregnated under conditions of heating and vacuum; then the cable paper bushing core saturated with mixed resin is cured and molded under certain pressure to form the above-mentioned resin impregnated paper core 2.

In the above process of fabricating the resin impregnated paper core 2, after the mixed resin is injected into the resin impregnated mold, degassing of the mixed resin shall be noted when the cable paper bushing core is impregnated in the resin, so as to eliminate and volatilize low molecular substances and free acids in anhydride in the mixed resin through uniform vacuum degassing, ensure the cable paper bushing core to be thoroughly impregnated, and thus ensuring that no crack or bubble appears when the cable paper bushing core is cured. This helps guarantee mechanical properties and electrical properties of the finished resin impregnated paper core 2. The manufacturing process of the oilpaper core is similar to the manufacturing process of the resin impregnated paper core, and will not be elaborated here.

In the bushing provided in the embodiments of the present disclosure, the flow-guiding rod 1 is cooled effectively using the coolant that enters the cooling channel of the flow-guiding rod 1. Thus, when a same level of voltage and current is transmitted, the external diameter of the flow-guiding rod 1 may be designed smaller. A total volume of the bushing, including a volume of the resin impregnated paper core 2, may be moderately reduced. When the volume of the resin impregnated paper core 2 is small, the impregnated resin of the resin impregnated paper core 2 is also very small, and the manufacturing difficulty of the resin impregnated paper core 2 may be reduced accordingly.

Embodiments of the present disclosure further provide a converter transformer system. The converter transformer system includes a converter valve tower, and a converter valve group in the converter valve tower is connected with a converter transformer via the bushing provided in the above embodiments. The converter valve tower is provided with a water cooling circulation loop, and the cooling channel of the flow-guiding rod in the bushing is connected to the water cooling circulation loop via the coolant inlet pipe and the coolant outlet pipe. The bushing in the converter transformer system according to the embodiments of the present disclosure has same advantages and may achieve same beneficial effects as the bushing provided in the above embodiments, which will not be elaborated here.

Figure 8:
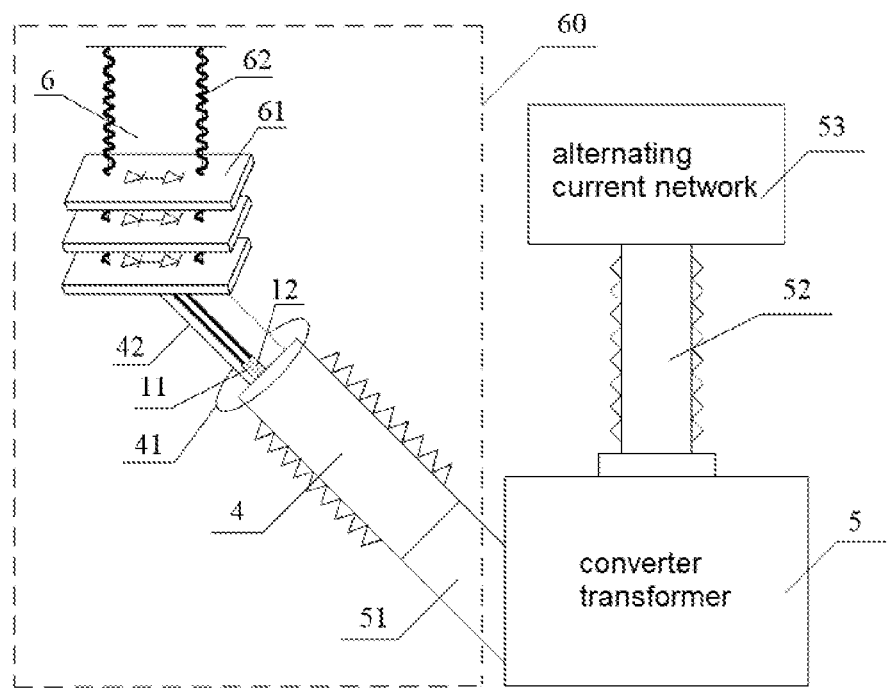
FIG. 8 is a schematic structure diagram of a converter transformer system provided in some embodiments of the present disclosure.

Exemplarily, referring to FIG. 8, a bushing used for connecting a converter transformer 5 and a converter valve tower 6 is a valve-side bushing 4 of the converter transformer system, which is the bushing provided in the above embodiments. The converter valve tower 6 is installed in a valve hall 60, and suspended installation is usually adopted. The converter valve tower 6 is usually includes a plurality of layers of converter valve groups 61 which are connected serially. Safety protection devices such as a protective shield and a lightning arrester string are usually installed on a top and/or a bottom of the converter valve tower 6. A grid side of the converter transformer 5 is usually connected with an alternating current network 53 via a grid-side bushing 52, a valve-side bushing hoist seat 51 is usually provided on the valve side of the converter transformer 5, and the valve-side bushing 4 of the converter transformer system is installed on the valve-side bushing hoist seat 51. The valve-side bushing 4 of the converter transformer system can be connected with the converter valve group 61 of the converter valve tower 6 via a balance pipe 42, and one end of the valve-side bushing 4 of the converter transformer system that is connected with the balance pipe 42 is usually sleeved with a balance ring 41. The converter valve tower 6 is usually provided with a water cooling circulation loop 62, and the water cooling channel in the valve-side bushing 4 of the converter transformer system can be connected to the water cooling circulation loop 62 via the water inlet pipe 11 and the water outlet pipe 12. The grid-side bushing 52 may be a bushing in the prior art or a bushing provided in the embodiments of the present disclosure. When the grid-side bushing 52 is the bushing provided in the embodiments of the present disclosure, the coolant inlet pipe and the coolant outlet pipe of the grid-side bushing 52 can also be connected to the water cooling circulation loop of the converter valve tower 6, and certainly it can also be connected to other cooling facilities.

In the description of the above embodiments, specific features, structures, materials or characteristics can be combined in an appropriate way in any one or more embodiments or samples.

The above embodiments are merely some specific embodiments of the present disclosure, but the protection scope of the present disclosure is not limited thereto. Any person skilled in the art could readily conceive of changes or replacement within the technical scope of the present disclosure, which shall all be included in the protection scope of the present disclosure. Therefore, the protection scope of the present disclosure shall be determined by the protection scope of the claims.

What is claimed is:

1. A flow-guiding rod, comprising:
    a rod portion including a cooling channel therein; and
    a coolant inlet pipe and a coolant outlet pipe provided at an end of the rod portion, wherein
    the coolant inlet pipe and the coolant outlet pipe are communicated with the cooling channel;
    the coolant is cooling water, the cooling channel is a water cooling channel, the coolant inlet pipe is a water inlet pipe, the coolant outlet pipe is a water outlet pipe, and the water inlet pipe and the water outlet pipe are connected to a water cooling circulation loop of a converter valve tower;
    the rod portion of the flow-guiding rod is of a tubular shape, and the rod portion includes a tube wall which is hollow; the water cooling channel is disposed inside the tube wall, which is hollow, of the rod portion;
    the tube wall is a triple-layer hollow tube wall, the triple-layer hollow tube wall includes a first-layer tube wall, a second-layer tube wall and a third-layer tube wall nested along a radial direction of the flow-guiding rod in sequence; in a length direction of the rod portion, a dimension of the first-layer tube wall, a dimension of the second-layer tube wall and a dimension of the third-layer tube wall are equal to each other; ends, located on a same end of the rod portion, of the first-layer tube wall, the second-layer tube wall and the third-layer tube wall are flushed with each other; a joint of the water inlet pipe jointed with the water cooling circulation loop of the converter valve tower and a joint of the water outlet pipe jointed with the water cooling circulation loop of the converter valve tower are located on a same end of the flow-guiding rod, and a grille or flow-guiding holes are formed in the second-layer tube wall at one end thereof away from the water inlet pipe or the water outlet pipe; the water cooling channel includes an outer annular water cooling channel disposed between the third-layer tube wall and the second-layer tube wall, and an inner annular water cooling channel disposed between the second-layer tube wall and the first-layer tube wall; in the length direction of the rod portion, a dimension of the inner annular water cooling channel and a dimension of the annular water cooling channel are equal to each other; and the outer annular water cooling channel is communicated with the inner annular water cooling channel via the grille or the flow-guiding holes; and the water inlet pipe is communicated with the outer annular water cooling channel, and the water outlet pipe is communicated with the inner annular water cooling channel.

2. The flow-guiding rod according to claim 1, further comprising a turbulent flow apparatus provided in the water cooling channel, wherein the turbulent flow apparatus includes:

a water inlet jointed with a water outlet of the water inlet pipe, and a water outlet jointed with a water inlet of the water outlet pipe.

3. The flow-guiding rod according to claim 2, wherein the turbulent flow apparatus includes a spiral flow guide.

4. The flow-guiding rod according to claim 1, further comprising a liquid pump and a flow control valve, which are connected with the water inlet pipe.

5. The flow-guiding rod according to claim 4, further comprising a temperature detector connected to the water outlet pipe.

6. The flow-guiding rod according to claim 5, further comprising a heat dissipating controller provided outside the rod portion, wherein the heat dissipating controller is connected with the temperature detector, the liquid pump and the flow control valve, and is configured to control working conditions of the liquid pump and the flow control valve according to a water temperature of the water outlet pipe detected by the temperature detector, such that a temperature of the flow-guiding rod is within a preset scope.

7. A bushing, comprising the flow-guiding rod according to claim 1.

8. The bushing according to claim 7, further comprising:

an insulating housing, wherein the flow-guiding rod is sleeved with the insulating housing; and a resin impregnated paper core or an oilpaper core sandwiched between the flow-guiding rod and the insulating housing.

9. A converter transformer system, comprising:

a converter valve tower including a converter valve group and a water cooling circulation loop;

the bushing according to claim 7; and a converter transformer connected with the converter valve tower via the bushing, wherein the cooling channel of the flow-guiding rod in the bushing is connected to the water cooling circulation loop via the coolant inlet pipe and the coolant outlet pipe.

* * * * *